United States Patent
Kim et al.

(10) Patent No.: US 10,542,626 B2
(45) Date of Patent: Jan. 21, 2020

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Ho Yoon Kim, Suwon-si (KR); Kyung Hwa Yu, Suwon-si (KR); Man Su Byun, Suwon-si (KR); Dae Heon Jeong, Suwon-si (KR); Min Kyoung Cheon, Suwon-si (KR); Soo Hwan Son, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/001,510

(22) Filed: Jun. 6, 2018

(65) Prior Publication Data
US 2019/0069412 A1 Feb. 28, 2019

(30) Foreign Application Priority Data

Aug. 31, 2017 (KR) .................... 10-2017-0110927

(51) Int. Cl.
*H01G 4/232* (2006.01)
*H01G 4/30* (2006.01)
(Continued)

(52) U.S. Cl.
CPC ........... *H05K 1/181* (2013.01); *H01G 4/2325* (2013.01); *H01G 4/30* (2013.01); *H05K 1/111* (2013.01);
(Continued)

(58) Field of Classification Search
CPC ............ H01G 2/06; H01G 4/12; H01G 4/232; H01G 4/2325; H01G 4/30; H01G 4/008;
(Continued)

(56) References Cited

U.S. PATENT DOCUMENTS 10,062,511 B1 * 8/2018 Park .................... H01G 2/06
10,347,425 B2 * 7/2019 Park
(Continued)

FOREIGN PATENT DOCUMENTS

JP 2003007567 A * 1/2003 ............... H01G 4/38
JP 3847265 B2 11/2006
(Continued)

OTHER PUBLICATIONS

Notice of Office Action issued in Korean Patent Application No. 10-2017-00110927, dated Sep. 12, 2017 (English translation).

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

A multilayer electronic component includes a capacitor body including a plurality of dielectric layers and a plurality of first and second internal electrodes and having first to sixth surfaces, the first and second internal electrodes being exposed through the third and fourth surfaces, respectively; first and second external electrodes including first and second connected portions respectively disposed on the third and fourth surfaces of the capacitor body and first and second band portions respectively extending from the first and second connected portions to portions of the first surface of the capacitor body, respectively; a first connection terminal disposed on the first band portion; and a second connection terminal disposed on the second band portion, wherein $0.05 \leq A1/A1 \leq 0.504$, where A1 is an area of the first (Continued)

or second connection terminal in a thickness-width direction, and A2 is an area of the first or second band portion in a width-length direction.

22 Claims, 6 Drawing Sheets

(51) Int. Cl.
*H05K 1/11* (2006.01)
*H05K 1/18* (2006.01)
*H01G 4/008* (2006.01)
*H01G 4/12* (2006.01)
*H01G 4/248* (2006.01)

(52) U.S. Cl.
CPC ........... *H01G 4/008* (2013.01); *H01G 4/1227* (2013.01); *H01G 4/1245* (2013.01); *H01G 4/248* (2013.01); *H05K 2201/10015* (2013.01); *H05K 2201/10636* (2013.01); *H05K 2201/2045* (2013.01)

(58) Field of Classification Search
CPC .... H01G 4/1227; H01G 4/1245; H01G 4/248; H05K 1/0271; H05K 1/11; H05K 1/111; H05K 1/18; H05K 1/181; H05K 3/3442; H05K 2201/09427; H05K 2201/10015; H05K 2201/10636; H05K 2201/2045; H05K 2203/0465
USPC ................. 174/260; 361/301.4, 308.2, 308.3
See application file for complete search history.

(56) References Cited

U.S. PATENT DOCUMENTS

| | | | |
|---|---|---|---|
| 2006/0231290 A1* | 10/2006 | Kariya | H01L 23/49811 174/258 |
| 2013/0037911 A1 | 2/2013 | Hattori et al. | |
| 2016/0093441 A1 | 3/2016 | Ann et al. | |
| 2016/0217926 A1 | 7/2016 | Jun et al. | |
| 2018/0323010 A1* | 11/2018 | Park | H05K 3/3442 |

FOREIGN PATENT DOCUMENTS

| | | | | |
|---|---|---|---|---|
| JP | 5472230 B2 | | 4/2014 | |
| JP | 2015216337 A | * | 12/2015 | ............. H01G 4/232 |
| JP | 2015216337 A | * | 12/2015 | ............. H01G 4/232 |
| KR | 10-2015-0127965 A | | 11/2015 | |
| KR | 10-2016-0037482 A | | 4/2016 | |
| KR | 10-2016-0090589 A | | 8/2016 | |

* cited by examiner

MULTILAYER ELECTRONIC COMPONENT AND BOARD HAVING THE SAME

CROSS-REFERENCE TO RELATED APPLICATION(S)

This application is based on and claims the benefit of priority to Korean Patent Application No. 10-2017-0110927 filed on Aug. 31, 2017 in the Korean Intellectual Property Office, the disclosure of which is incorporated herein by reference in its entirety.

TECHNICAL FIELD

The present disclosure relates to a multilayer electronic component and a board having the same.

BACKGROUND

A multilayer capacitor, a multilayer electronic component, has a structure in which internal electrodes having different polarities are alternately stacked between a plurality of dielectric layers.

The multilayer capacitor has been used as a component of various electronic apparatuses since it has a small size, implements a high capacitance, and may be easily mounted.

However, since a dielectric material of the dielectric layer may have piezoelectric properties, vibration sound may be generated due to a piezoelectric phenomenon, and when a period of an applied voltage is within an audio frequency band, displacement of the multilayer capacitor may become vibrations to be transferred to a circuit board through solders, and the vibrations transferred to the circuit board as described above may be heard as sound. Such a sound is known as acoustic noise.

When a device is operated in a silent environment, a user may recognize the acoustic noise as abnormal sound and may be led to believe that a fault has occurred in the device.

In addition, in a device having an audio circuit, acoustic noise may overlap an audio output, such that quality of the device may be deteriorated.

Meanwhile, external electrodes of the multilayer capacitor and the circuit board are connected to each other by solders. In this case, the solders are formed in an inclined state at a predetermined height along surfaces of the external electrodes on opposite side surfaces or opposite end surfaces of a capacitor body.

In this case, since solders serve as a medium transferring the vibrations generated from the multilayer capacitor to the circuit board, as a volume and a height of the solders are increased, the vibrations of the multilayer capacitor are more easily transferred to the circuit board, such that a magnitude of the generated acoustic noise is increased.

SUMMARY

An aspect of the present disclosure may provide a multilayer electronic component in which acoustic noise may be decreased, and a board having the same.

According to another aspect of the present disclosure, a multilayer electronic component may include: a capacitor body including a plurality of dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, one ends of the first and second internal electrodes being exposed through the third and fourth surfaces, respectively; first and second external electrodes including first and second connected portions respectively disposed on the third and fourth surfaces of the capacitor body and first and second band portions respectively extending from the first and second connected portions to portions of the first surface of the capacitor body, respectively; a first connection terminal disposed on the first band portion; and a second connection terminal disposed on the second band portion, wherein $0.05 \leq A1/A2 \leq 0.504$, where A1 is an area of the first or second connection terminal in a thickness-width direction, and A2 is an area of the first or second band portion in a width-length direction.

The first and second connection terminals may be bump terminals.

The bump terminals may be formed of alumina.

The first connection terminal may be disposed so that a first solder accommodating portion open toward the third surface of the capacitor body is provided on the first surface of the capacitor body, and the second connection terminal may be disposed so that a second solder accommodating portion open toward the fourth surface of the capacitor body is provided on the first surface of the capacitor body.

The first connection terminal may be disposed to be spaced apart from end portions of the fifth and sixth surfaces of the capacitor body, and the second connection terminal may be disposed to be spaced apart from end portions of the fifth and sixth surfaces of the capacitor body.

When a length and a width of the capacitor body are 1.6 mm and 0.8 mm, respectively, $0.078 \leq A1/A2 \leq 0.504$, where A1 is the area of the first or second connection terminal in the thickness-width direction and A2 is the area of the first or second band portion in the width-length direction.

When a length and a width of the capacitor body are 2.0 mm and 1.2 mm, respectively, $0.059 \leq A1/A2 \leq 0.471$ in which A1 is the area of the first or second connection terminal in the thickness-width direction and A2 is the area of the first or second band portion in the width-length direction.

When a length and a width of the capacitor body are 3.2 mm and 2.0 mm, respectively, $0.072 \leq A1/A2 \leq 0.441$ in which A1 is the area of the first or second connection terminal in the thickness-width direction and A2 is the area of the first or second band portion in the width-length direction.

According to another aspect of the present disclosure, a board having a multilayer electronic component may include: a circuit board having first and second electrode pads disposed on one surface thereof; and the multilayer electronic component as described above mounted on the circuit board so that the first and second connection terminals are connected to the first and second electrode pads, respectively.

According to still another aspect of the present disclosure, a multilayer electronic component may include: a capacitor body including a plurality of dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, one ends of the first and second internal electrodes being exposed through the third and fourth surfaces, respectively; first and second external electrodes including first and second connected portions respectively disposed on the third and fourth surfaces of the capacitor body and first and second band portions respectively extending from the first and second connected portions to portions of the first surface of the capacitor body, respectively; a first connection terminal disposed on the first band portion; and a second connection terminal disposed on the second band portion, wherein outermost portions of the first and second connection terminals in the length direction are spaced apart from the third and fourth surfaces of the capacitor body in the length direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
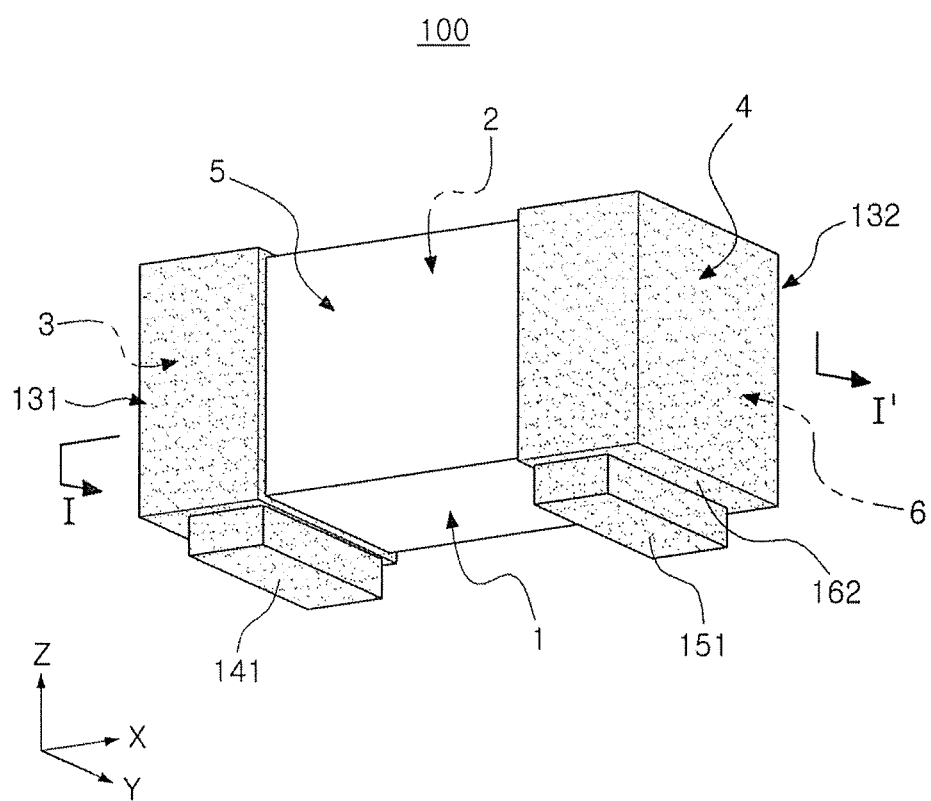
FIG. 1 is a perspective view illustrating a multilayer electronic component according to an exemplary embodiment in the present disclosure.
Figure 2A:
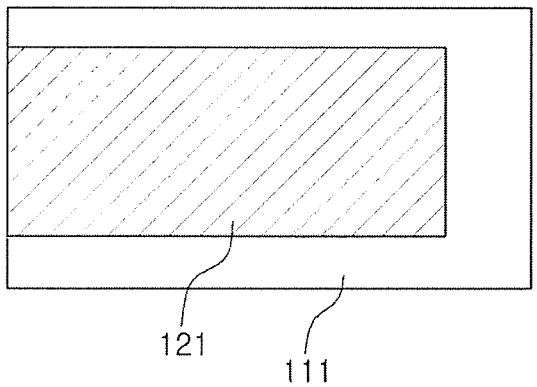
FIGS. 2A and 2B are plan views illustrating, respectively, first and second internal electrodes of the multilayer electronic component according to an exemplary embodiment in the present disclosure.
Figure 2B:
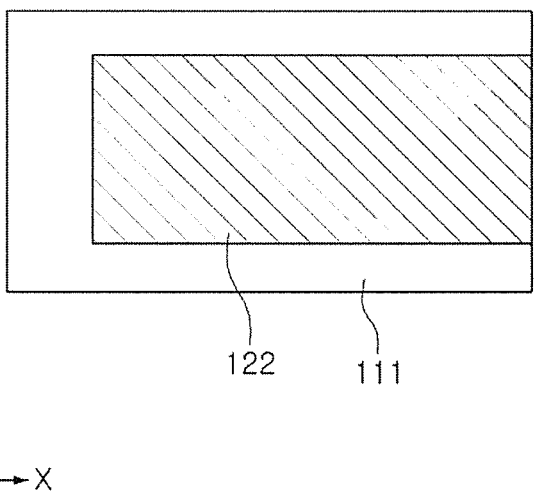
Figure 3:
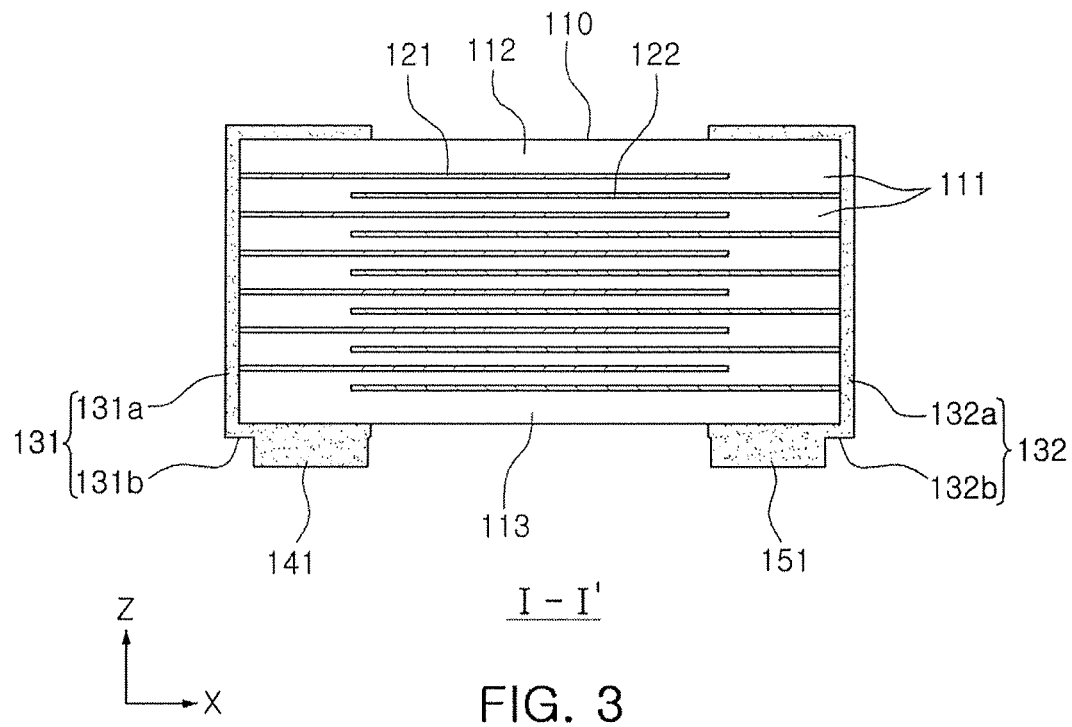
FIG. 3 is a cross-sectional view taken along line I-I' of FIG. 1.
Figure 4:
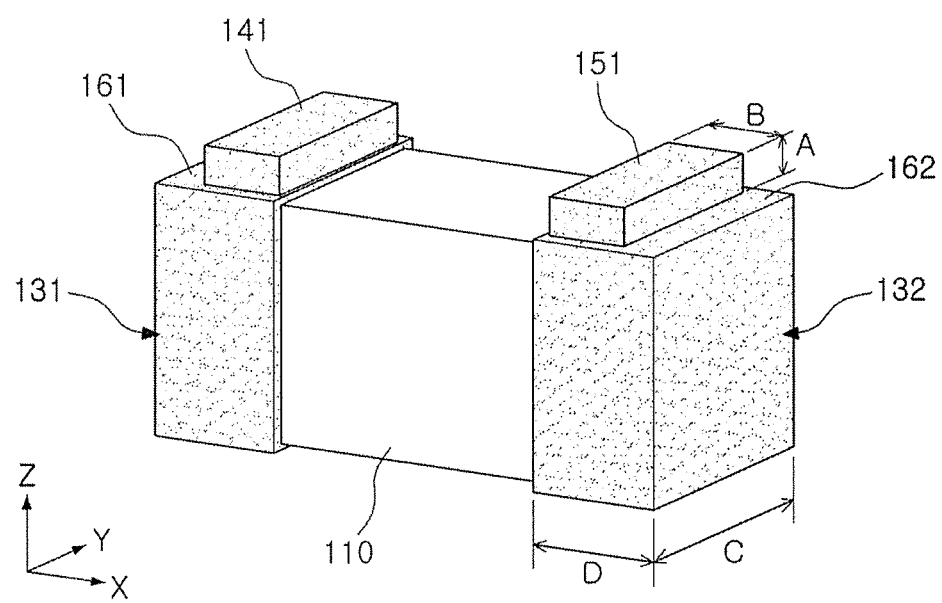
FIG. 4 is a reversed perspective view of FIG. 1.

FIG. 1 is a perspective view illustrating a multilayer electronic component according to an exemplary embodiment in the present disclosure, FIGS. 2A and 2B are plan views illustrating, respectively, first and second internal electrodes of the multilayer electronic component according to an exemplary embodiment in the present disclosure, and FIG. 3 is a cross-sectional view taken along line I-I' of FIG. 1.

Referring to FIGS. 1 through 3, a multilayer electronic component 100 according to an exemplary embodiment in the present disclosure may include a capacitor body 110, first and second external electrodes 131 and 132, and first and second connection terminals 141 and 151.

Hereinafter, directions of the capacitor body 110 will be defined in order to clearly describe exemplary embodiments in the present disclosure. X, Y and Z in the drawings refer to a length direction, a width direction, and a thickness direction of the capacitor body 110, respectively. In addition, in the present exemplary embodiment, the thickness direction refers to a stacked direction in which dielectric layers are stacked.

The capacitor body 110 may be formed by stacking and then sintering a plurality of dielectric layers 111 in the Z direction, and may include the plurality of dielectric layers 111 and a plurality of first and second internal electrodes 121 and 122 alternately disposed in the Z direction with respective dielectric layers 111 interposed therebetween.

In addition, covers 112 and 113 having a predetermined thickness may be formed, respectively, at both sides of the capacitor body 110 in the Z direction, if necessary.

In this case, the respective adjacent dielectric layers 111 of the capacitor body 110 may be integrated with each other so that boundaries therebetween are not readily apparent.

The capacitor body 110 may have a substantially hexahedral shape. However, a shape of the capacitor body 110 is not limited thereto.

In the present exemplary embodiment, for convenience of explanation, first and second surfaces 1 and 2 of the capacitor body 110 refer to opposite surfaces of the capacitor body 110 opposing each other in the Z direction, third and fourth surfaces 3 and 4 of the capacitor body 110 refer to opposite surfaces of the capacitor body 110 connected to the first and second surfaces 1 and 2 and opposing each other in the X direction, and fifth and sixth surfaces 5 and 6 of the capacitor body 110 refer to opposite surfaces of the capacitor body 110 connected to the first and second surfaces 1 and 2, connected to the third and fourth surfaces 3 and 4, and opposing each other in the Y direction. In the present exemplary embodiment, the first surface 1 may be a mounting surface.

In addition, the dielectric layer 111 may include a ceramic material having a high dielectric constant, such as barium titanate ($BaTiO_3$) based ceramic powders, or the like. However, a material of the dielectric layer 111 is not limited thereto.

An example of the barium titanate ($BaTiO_3$) based ceramic powders may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, an example of the barium titanate ($BaTiO_3$) based ceramic powders is not limited thereto.

In addition, the dielectric layer 111 may further include a ceramic additive, an organic solvent, a plasticizer, a binder, a dispersant, and the like, in addition to the ceramic powders. As the ceramic additive, for example, a transition metal oxide or a transition metal carbide, a rare earth element, magnesium (Mg), aluminum (Al), or the like, may be used.

The first and second internal electrodes 121 and 122, which are electrodes having different polarities, may be alternately disposed to face each other in the Z direction with respective dielectric layers 111 interposed therebetween, and one ends of the first and second internal electrodes 121 and 122 may be exposed through the third and fourth surfaces 3 and 4 of the capacitor body 110, respectively.

In this case, the first and second internal electrodes 121 and 122 may be electrically insulated from each other by each of the dielectric layers 111 disposed therebetween.

The end portions of the first and second internal electrodes 121 and 122 alternately exposed through the third and fourth surfaces 3 and 4 of the capacitor body 110, respectively, may be electrically connected to first and second external electrodes 131 and 132 disposed on third and fourth surfaces 3 and 4 of a capacitor body 110 to be described below, respectively.

In this case, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing each other.

In this case, a capacitance of the multilayer electronic component 100 may be in proportion to an area of the first and second internal electrodes 121 and 122 overlapping each other in the Z direction.

Voltages having different polarities may be provided to the first and second external electrodes 131 and 132, respectively, and the first and second external electrodes 131 and 132 may be electrically connected to the exposed portions of the first and second internal electrodes 121 and 122, respectively.

Plating layers may be formed on surfaces of the first and second external electrodes 131 and 132, if necessary.

For example, the first and second external electrodes 131 and 132 may include first and second conductive layers, first and second nickel (Ni) plating layers formed on the first and second conductive layers, and first and second tin (Sn) plating layers formed on the first and second nickel plating layers, respectively.

The first external electrode 131 may include a first connected portion 131a and a first band portion 131b.

The first connected portion 131a may be formed on the third surface 3 of the capacitor body 110 and be connected to the first internal electrodes 121, and the first band portion 131b may extend from the first connected portion 131a to a portion of the first surface 1 of the capacitor body 110, which is the mounting surface of the capacitor body 110, and be connected to the first connection terminal 141.

In this case, the first band portion 131b may further extend to a portion of the second surface 2 of the capacitor body 110 and portions of the fifth and sixth surfaces 5 and 6 of the capacitor body 110, if necessary, in order to improve adhesion strength, or the like.

The second external electrode 132 may include a second connected portion 132a and a second band portion 132b.

The second connected portion 132a may be formed on the fourth surface 4 of the capacitor body 110 and be connected to the second internal electrodes 122, and the second band portion 132b may extend from the second connected portion 132a to a portion of the first surface 1 of the capacitor body 110, which is the mounting surface of the capacitor body 110, and be connected to the second connection terminal 151.

In this case, the second band portion 132b may further extend to a portion of the second surface 2 of the capacitor body 110 and portions of the fifth and sixth surfaces 5 and 6 of the capacitor body 110, if necessary, in order to improve adhesion strength, or the like.

The first connection terminal 141 may be formed of a conductor, and may have a first connection surface facing the first band portion 131b of the first external electrode 131 on the first surface 1 of the capacitor body 110, a second connection surface opposing the first connection surface in the Z direction, and first circumferential surfaces connecting the first and second connection surfaces to each other.

In addition, the first connection terminal 141 may cover a portion of the first band portion 131b. Therefore, a portion of a lower surface of the first band portion 131b that is not covered by the first connection terminal 141 on the first surface 1 of the capacitor body 110, which is the mounting surface of the capacitor body 110, may become a first solder accommodating portion as a solder pocket.

In addition, the first connection terminal 141 may be disposed to be biased toward the center of the capacitor body 110 in the X direction.

In this case, a length of the first connection terminal 141 in the X direction may be smaller than a length of the first band portion 131b.

Therefore, the first solder accommodating portion may be open toward the third surface 3 of the capacitor body 110, and a space G as large as possible as the solder pocket may thus be secured.

In addition, the first connection terminal 141 may be disposed to be spaced apart from end portions of the fifth and sixth surfaces 5 and 6 of the capacitor body 110.

Therefore, the first band portion 131b may have a structure in which steps are formed at one side of the first connection terminal 141 in the X direction and both sides of the first connection terminal 141 in the Y direction.

The second connection terminal 151 may be formed of a conductor, and may have a third connection surface facing the second band portion 132b of the second external electrode 132 on the first surface 1 of the capacitor body 110, a fourth connection surface opposing the third connection surface in the Z direction, and second circumferential surfaces connecting the third and fourth connection surfaces to each other.

In addition, the second connection terminal 151 may cover a portion of the second band portion 132b. Therefore, a portion of a lower surface of the second band portion 132b that is not covered by the second connection terminal 151 on the first surface 1 of the capacitor body 110, which is the mounting surface of the capacitor body 110, may become a second solder accommodating portion as a solder pocket.

In addition, the second connection terminal 151 may be disposed to be biased toward the center of the capacitor body 110 in the X direction.

Here, a length of the second connection terminal 151 in the X direction may be smaller than a length of the second band portion 132b.

Therefore, the second solder accommodating portion may be open toward the fourth surface 4 of the capacitor body 110, and a space as large as possible as the solder pocket may thus be secured.

In addition, the second connection terminal 151 may be disposed to be spaced apart from end portions of the fifth and sixth surfaces 5 and 6 of the capacitor body 110.

Therefore, the second band portion 132b may have a structure in which steps are formed at one side of the second connection terminal 151 in the X direction and both sides of the second connection terminal 151 in the Y direction.

In other words, in the present exemplary embodiment, the first connection terminal 141 may be disposed on the first band portion 131b to be spaced apart from the first connected portion 131a, and the second connection terminal 151 may be disposed on the second band portion 132b to be spaced apart from the second connected portion 132a.

Therefore, a first space portion 161 open toward directions corresponding to the third surface 3, the fifth surface 5, and the sixth surface 6 of the capacitor body 110 may be provided on the lower surface of the first band portion 131b, and may become the first solder accommodating portion. That is, an outermost portion of the first connection terminal 141 in the length direction may be spaced apart from the third surface 3 of the capacitor body 110 in the length direction.

Therefore, a second space portion 162 open toward directions corresponding to the fourth surface 4, the fifth surface 5, and the sixth surface 6 of the capacitor body 110 may be provided on the lower surface of the second band portion 132b, and may become the second solder accommodating portion. That is, an outermost portion of the second connection terminal 151 in the length direction may be spaced apart from the fourth surface 4 of the capacitor body 110 in the length direction.

In the following description for exemplary embodiments, the space portions 161 and 162 and the solder accommodating portions will be denoted by the same reference numerals.

The first and second connection terminals 141 and 151 may space the capacitor body 110 apart from the circuit board by a predetermined distance to thus suppress piezoelectric vibrations generated from the capacitor body 110 from being introduced into the circuit board.

In addition, the first and second connection terminals 141 and 151 may include plating layers, if necessary. The plating layers may include nickel (Ni) plating layers formed on the first and second connection terminals 141 and 151 and tin (Sn) plating layers formed on the nickel plating layers.

Meanwhile, lower surfaces of the first connection terminal 141 and the second connection terminal 151 may be flat. Therefore, the first connection terminal and the second connection terminal 141 or 151 may have a substantially hexahedral shape.

In the present exemplary embodiment, $0.05 \leq A1/A2 \leq 0.504$, where A1 is an area of the first or second connection terminal 141 or 151 in a thickness-width (A-B) direction, and A2 is an area of the first or second band portion 131b or 132b in a width-length (D-C) direction.

Figure 7:
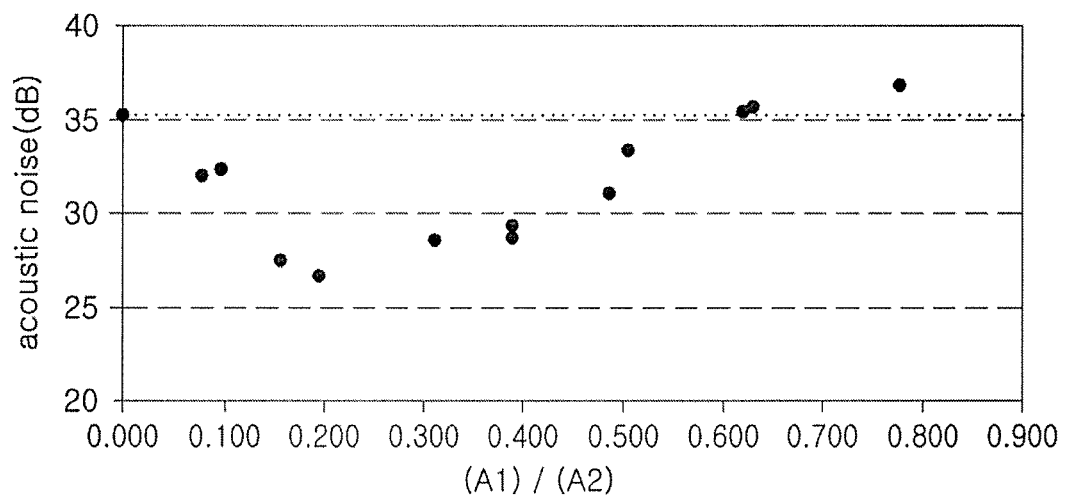
FIGS. 7 through 9 are graphs illustrating ratios of an area of a connection terminal in a thickness-width direction to an area of a band portion in a width-length direction.

Table 1 and FIG. 7 illustrate changes in acoustic noise when a length of the capacitor body 110 is 1.6 mm, a width of the capacitor body 110 is 0.8 mm, an area of the first or second connection terminal 141 or 151 in a thickness-width direction is A1, and an area of the first or second band portion 131b or 132b in a width-length direction is A2.

A preferable range of A1/A2 according to the present exemplary embodiment based on acoustic noise (35.3 dB) in a case in which a connection terminal does not exist is as follows: $0.078 \leq A1/A2 \leq 0.504$.

TABLE 1

| Capacitor Body | | Connection Terminal | | Band Portion | | | | | |
|---|---|---|---|---|---|---|---|---|---|
| Length [mm] | Width [mm] | Thickness (A) [mm] | Width (B) [mm] | Length (C) [mm] | Width (D) [mm] | Area (A×B) [mm²] | Area (C×D) [mm²] | (A×B)/(C×D) | Acoustic Noise [dB] |
| 1.6 | 0.8 | 0 | 0 | 0.86 | 0.3 | 0.0000 | 0.2580 | 0.000 | 35.3 |
| | | 0.1 | 0.2 | 0.86 | 0.3 | 0.0200 | 0.2580 | 0.078 | 32.1 |
| | | 0.2 | 0.2 | 0.86 | 0.3 | 0.0400 | 0.2580 | 0.155 | 27.5 |
| | | 0.4 | 0.2 | 0.86 | 0.3 | 0.0800 | 0.2580 | 0.310 | 28.6 |
| | | 0.5 | 0.2 | 0.86 | 0.3 | 0.1000 | 0.2580 | 0.388 | 28.8 |
| | | 0.65 | 0.2 | 0.86 | 0.3 | 0.1300 | 0.2580 | 0.504 | 33.4 |
| | | 0.8 | 0.2 | 0.86 | 0.3 | 0.1600 | 0.2580 | 0.620 | 35.5 |
| | | 0.1 | 0.25 | 0.86 | 0.3 | 0.0250 | 0.2580 | 0.097 | 32.4 |
| | | 0.2 | 0.25 | 0.86 | 0.3 | 0.0500 | 0.2580 | 0.194 | 26.7 |
| | | 0.4 | 0.25 | 0.86 | 0.3 | 0.1000 | 0.2580 | 0.388 | 29.3 |
| | | 0.5 | 0.25 | 0.86 | 0.3 | 0.1250 | 0.2580 | 0.484 | 31.1 |
| | | 0.65 | 0.25 | 0.86 | 0.3 | 0.1625 | 0.2580 | 0.630 | 35.7 |
| | | 0.8 | 0.25 | 0.86 | 0.3 | 0.2000 | 0.2580 | 0.775 | 36.9 |

Figure 8:
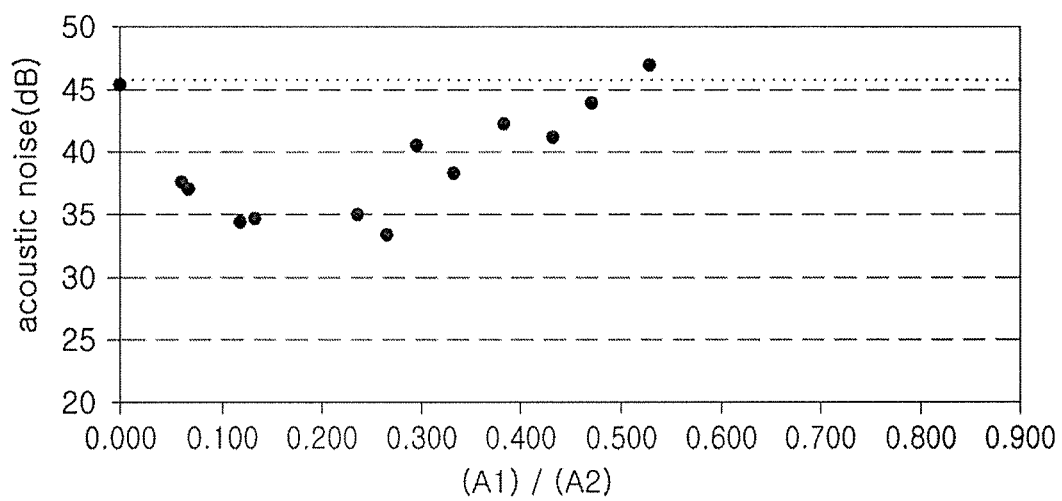

Table 2 and FIG. 8 illustrate changes in acoustic noise when a length of the capacitor body 110 is 2.0 mm, a width of the capacitor body 110 is 1.2 mm, an area of the first or second connection terminal 141 or 151 in a thickness-width direction is A1, and an area of the first or second band portion 131b or 132b in a width-length direction is A2.

A preferable range of A1/A2 according to the present exemplary embodiment based on acoustic noise (45.5 dB) in a case in which a connection terminal does not exist is as follows: $0.05 \leq A1/A2 \leq 0.471$.

TABLE 2

| Capacitor Body | | Connection Terminal | | Band Portion | | | | | |
|---|---|---|---|---|---|---|---|---|---|
| Length [mm] | Width [mm] | Thickness (A) [mm] | Width (B) [mm] | Length (C) [mm] | Width (D) [mm] | Area (A×B) [mm²] | Area (C×D) [mm²] | (A×B)/(C×D) | Acoustic Noise [dB] |
| 2.0 | 1.2 | 0 | 0 | 1.36 | 0.5 | 0.0000 | 0.6800 | 0.000 | 45.5 |
| | | 0.1 | 0.4 | 1.36 | 0.5 | 0.0400 | 0.6800 | 0.059 | 37.7 |
| | | 0.2 | 0.4 | 1.36 | 0.5 | 0.0800 | 0.6800 | 0.118 | 34.5 |
| | | 0.4 | 0.4 | 1.36 | 0.5 | 0.1600 | 0.6800 | 0.235 | 35.1 |
| | | 0.5 | 0.4 | 1.36 | 0.5 | 0.2000 | 0.6800 | 0.294 | 40.7 |

TABLE 2-continued

| Capacitor Body | | Connection Terminal | | Band Portion | | | | | |
|---|---|---|---|---|---|---|---|---|---|
| | | Thickness | Width | Length | Width | Area | Area | | Acoustic |
| Length [mm] | Width [mm] | (A) [mm] | (B) [mm] | (C) [mm] | (D) [mm] | (AxB) [mm$^2$] | (CxD) [mm$^2$] | (AxB)/ (CxD) | Noise [dB] |
| | | 0.65 | 0.4 | 1.36 | 0.5 | 0.2600 | 0.6800 | 0.382 | 42.4 |
| | | 0.8 | 0.4 | 1.36 | 0.5 | 0.3200 | 0.6800 | 0.471 | 44.4 |
| | | 0.1 | 0.45 | 1.36 | 0.5 | 0.0450 | 0.6800 | 0.066 | 37.2 |
| | | 0.2 | 0.45 | 1.36 | 0.5 | 0.0900 | 0.6800 | 0.132 | 34.8 |
| | | 0.4 | 0.45 | 1.36 | 0.5 | 0.1800 | 0.6800 | 0.265 | 33.5 |
| | | 0.5 | 0.45 | 1.36 | 0.5 | 0.2250 | 0.6800 | 0.331 | 38.4 |
| | | 0.65 | 0.45 | 1.36 | 0.5 | 0.2925 | 0.6800 | 0.430 | 41.3 |
| | | 0.8 | 0.45 | 1.36 | 0.5 | 0.3600 | 0.6800 | 0.529 | 46.1 |

Figure 9:
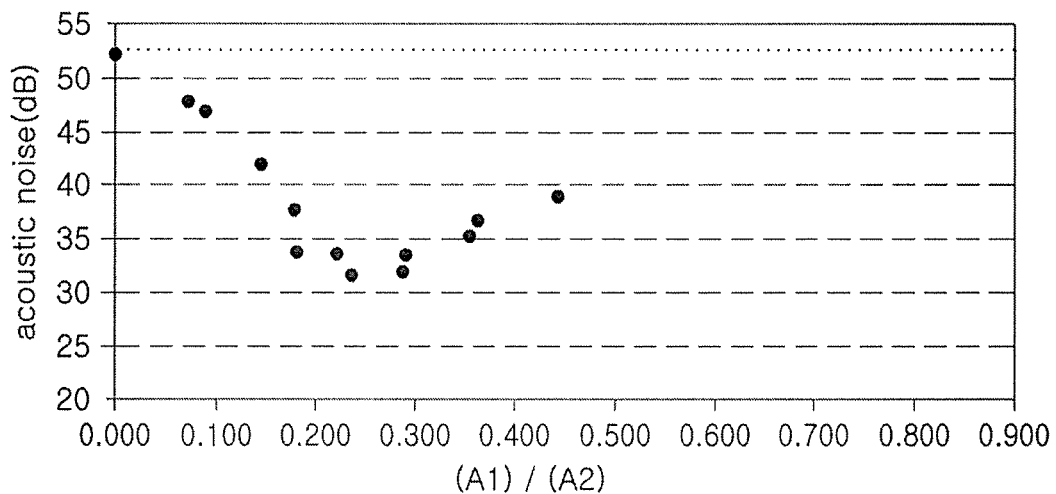

Table 3 and FIG. 9 illustrate changes in acoustic noise when a length of the capacitor body 110 is 3.2 mm, a width of the capacitor body 110 is 2.0 mm, an area of the first or second connection terminal 141 or 151 in a thickness-width direction is A1, and an area of the first or second band portion 131b or 132b in a width-length direction is A2.

A preferable range of A1/A2 according to the present exemplary embodiment based on acoustic noise (52.3 dB) in a case in which a connection terminal does not exist is as follows: 0.072≤A1/A2≤0.441.

TABLE 3

| Capacitor Body | | Connection Terminal | | Band Portion | | | | | |
|---|---|---|---|---|---|---|---|---|---|
| | | Thickness | Width | Length | Width | Area | Area | | Acoustic |
| Length [mm] | Width [mm] | (A) [mm] | (B) [mm] | (C) [mm] | (D) [mm] | (AXB) [mm$^2$] | (CxD) [mm$^2$] | (AxB)/ (CxD) | Noise [dB] |
| 3.28 | 2.08 | 0 | 0 | 2.08 | 0.6 | 0.0000 | 1.2480 | 0.000 | 52.3 |
| | | 0.2 | 0.45 | 2.08 | 0.6 | 0.0900 | 1.2480 | 0.072 | 47.8 |
| | | 0.4 | 0.45 | 2.08 | 0.6 | 0.1800 | 1.2480 | 0.144 | 42 |
| | | 0.5 | 0.45 | 2.08 | 0.6 | 0.2250 | 1.2480 | 0.180 | 33.8 |
| | | 0.65 | 0.45 | 2.08 | 0.6 | 0.2925 | 1.2480 | 0.234 | 31.6 |
| | | 0.8 | 0.45 | 2.08 | 0.6 | 0.3600 | 1.2480 | 0.288 | 33.4 |
| | | 1 | 0.45 | 2.08 | 0.6 | 0.4500 | 1.2480 | 0.361 | 36.7 |
| | | 0.2 | 0.55 | 2.08 | 0.6 | 0.1100 | 1.2480 | 0.088 | 46.9 |
| | | 0.4 | 0.55 | 2.08 | 0.6 | 0.2200 | 1.2480 | 0.176 | 37.8 |
| | | 0.5 | 0.55 | 2.08 | 0.6 | 0.2750 | 1.2480 | 0.220 | 33.6 |
| | | 0.65 | 0.55 | 2.08 | 0.6 | 0.3575 | 1.2480 | 0.286 | 32 |
| | | 0.8 | 0.55 | 2.08 | 0.6 | 0.4400 | 1.2480 | 0.353 | 35.2 |
| | | 1 | 0.55 | 2.08 | 0.6 | 0.5500 | 1.2480 | 0.441 | 38.9 |

The first and second connection terminals 141 and 151 may be bump terminals.

Meanwhile, when the first and second connection terminals 141 and 151, which are the bump terminals, are formed of a material having a high Young's modulus or high rigidity, vibrations of a multilayer capacitor may further be suppressed, such that acoustic noise may further be decreased. Therefore, in the present exemplary embodiment, the bump terminals may be formed of alumina having a Young's modulus of 300 to 400 GPa.

Figure 5:
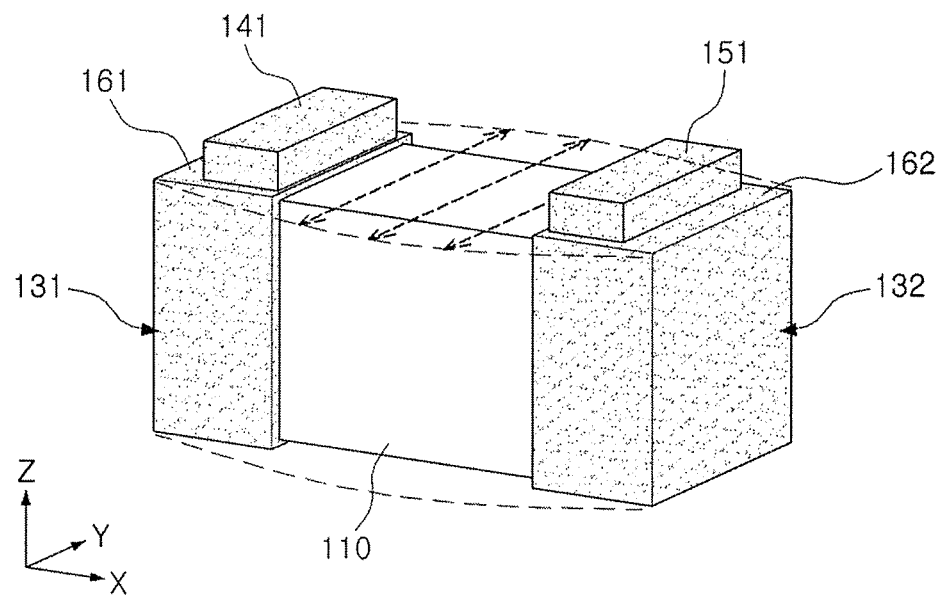
FIG. 5 is a perspective view illustrating vibrations of a multilayer capacitor in a width direction.

When the bump terminals are formed of the alumina as described above and are attached to the first and second band portions 131b and 132b, vibrations of the multilayer capacitor 100 in the Y direction may be suppressed as illustrated in FIG. 5.

Figure 6:
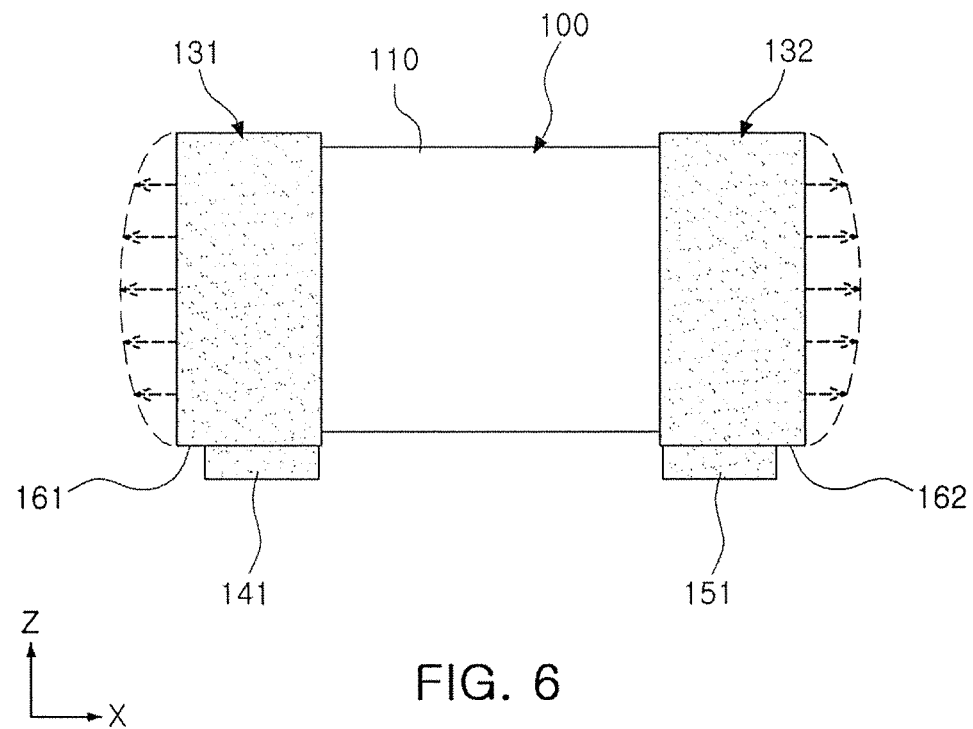
FIG. 6 is a perspective view illustrating vibrations of the multilayer capacitor in a length direction.

As illustrated in FIG. 6, the solder pockets 161 and 162 of the first and second connection terminals 141 and 151 may block a transfer of vibrations of the multilayer capacitor in the X direction. Resultantly, according to the present exemplary embodiment, the vibrations of the multilayer capacitor 100 in both of the X direction and the Y direction may be suppressed, such that an acoustic noise decreasing effect may be significantly improved.

Figure 10:
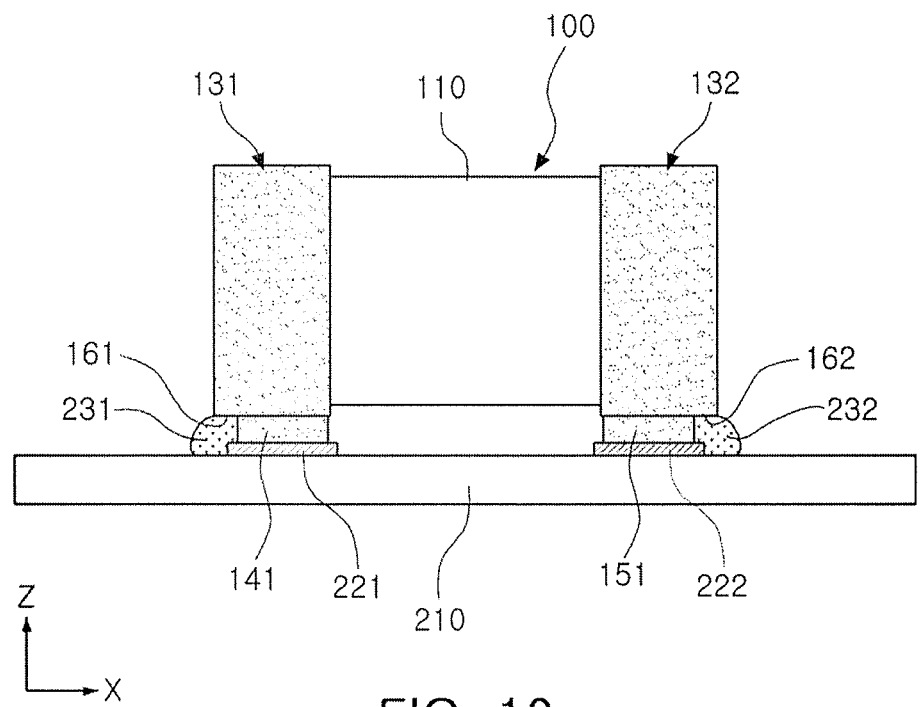
FIG. 10 is a schematic front view illustrating a state in which the multilayer electronic component according to an exemplary embodiment in the present disclosure is mounted on a circuit board.

FIG. 10 is a schematic front view illustrating a state in which the multilayer electronic component according to an exemplary embodiment in the present disclosure is mounted on a circuit board.

When voltages having different polarities are applied to the first and second external electrodes 131 and 132 formed in the multilayer electronic component 100 in a state in which the multilayer electronic component 100 is mounted on a circuit board 210, the capacitor body 110 may be expanded and contracted in the thickness direction due to an inverse piezoelectric effect of the dielectric layers 111, and both end portions of the first and second external electrodes 131 and 132 may be contracted and expanded as opposed to the expansion and the contraction of the capacitor body 110 in the thickness direction due to a Poisson effect.

Such a contraction and expansion may generate vibrations. In addition, the vibrations may be transferred from the first and second external electrodes 131 and 132 to the circuit board 210, and a sound may thus be radiated from the circuit board 210, which becomes the acoustic noise.

Referring to FIG. 11, a board having a multilayer electronic component according to the present exemplary embodiment may include the circuit board 210 having first and second electrode pads 221 and 222 disposed on one surface thereof and the multilayer electronic component 100 mounted on an upper surface of the circuit board 210 so that the first and second connection terminals 141 and 151 thereof are connected to the first and second electrode pads 221 and 222, respectively.

In the present exemplary embodiment, a case in which the multilayer electronic component 100 is mounted on the circuit board 210 by solders 231 and 232 is illustrated and described, but conductive pastes may be used instead of the solders, if necessary.

According to the present exemplary embodiment, the piezoelectric vibrations transferred to the circuit board through the first and second external electrodes 131 and 132 of the multilayer electronic component 100 may be absorbed through elasticity of the first and second connection terminals 141 and 151, and the acoustic noise may thus be decreased.

Here, the first and second solder accommodating portions 161 and 162 provided by first and second cut portions of the first and second connection terminals 141 and 151, respectively, may serve as the solder pockets that may trap the solders 231 and 232 on the first surface of the capacitor body 110.

Therefore, the solders 231 and 232 may be more effectively trapped in the first and second solder accommodating portions 161 and 162, respectively, and formation of solder fillets toward the second surface of the capacitor body 110 may thus be suppressed.

Therefore, a piezoelectric vibration transfer path of the multilayer electronic component 100 may be blocked, and the solder fillets and a maximum displacement point in the capacitor body 110 may be spaced apart from each other to significantly improve an acoustic noise decreasing effect of the multilayer electronic component 100.

In addition, according to the present exemplary embodiment, a vibration amount of the piezoelectric vibrations of the multilayer electronic component transferred to the circuit board at an audio frequency within 20 kHz of the multilayer electronic component may be effectively suppressed by the acoustic noise decreasing structure described above.

Therefore, high frequency vibrations of the multilayer electronic component may be decreased to prevent malfunctions of sensors that may be caused by high frequency vibrations in a high frequency region of 20 kHz or more of the multilayer electronic component in information technology (IT) or industry/electrical component fields and suppress accumulation of internal fatigue of the sensors due to vibrations for a long period of time.

As set forth above, according to the exemplary embodiment in the present disclosure, the acoustic noise of the multilayer electronic component may be decreased by controlling a height of the solders formed on the multilayer capacitor.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a capacitor body including a plurality of dielectric layers and a plurality of first and second internal electrodes alternately disposed with respective dielectric layers interposed therebetween and having first and second surfaces opposing each other in a thickness direction, third and fourth surfaces connected to the first and second surfaces and opposing each other in a length direction, and fifth and sixth surfaces connected to the first and second surfaces, connected to the third and fourth surfaces, and opposing each other in a width direction, one end of each of the first and second internal electrodes being exposed through the third and fourth surfaces, respectively;
first and second external electrodes including first and second connected portions respectively disposed on the third and fourth surfaces of the capacitor body and first and second band portions respectively extending from the first and second connected portions to portions of the first surface of the capacitor body, respectively;
a first connection terminal disposed on the first band portion; and
a second connection terminal disposed on the second band portion,
wherein $0.05 \leq A1/A2 \leq 0.504$, where A1 is an area of the first or second connection terminal in a thickness-width direction, and A2 is an area of the first or second band portion in a width-length direction.

2. A multilayer electronic component comprising:
a capacitor body including a plurality of dielectric layers and a plurality of first and second internal electrodes alternately disposed with respective dielectric layers interposed therebetween and having first and second surfaces opposing each other in a thickness direction, third and fourth surfaces connected to the first and second surfaces and opposing each other in a length direction, and fifth and sixth surfaces connected to the first and second surfaces, connected to the third and fourth surfaces, and opposing each other in a width direction, one end of each of the first and second internal electrodes being exposed through the third and fourth surfaces, respectively;
first and second external electrodes including first and second connected portions respectively disposed on the third and fourth surfaces of the capacitor body and first and second band portions respectively extending from the first and second connected portions to portions of the first surface of the capacitor body, respectively;
a first connection terminal disposed on the first band portion; and
a second connection terminal disposed on the second band portion,
wherein a length and a width of the capacitor body are 1.6 mm and 0.8 mm, respectively, and
wherein $0.078 \leq A1/A2 \leq 0.504$, where A1 is the area of the first or second connection terminal in the thickness-width direction and A2 is the area of the first or second band portion in the width-length direction.

3. The multilayer electronic component of claim 2, wherein the first and second connection terminals are bump terminals.

4. The multilayer electronic component of claim 3, wherein the bump terminals are made of alumina.

5. The multilayer electronic component of claim 2, wherein the first connection terminal is disposed so that a first solder accommodating portion open toward the third surface of the capacitor body is provided on the first surface of the capacitor body, and
the second connection terminal is disposed so that a second solder accommodating portion open toward the fourth surface of the capacitor body is provided on the first surface of the capacitor body.

6. The multilayer electronic component of claim 2, wherein the first connection terminal is disposed to be spaced apart from end portions of the fifth and sixth surfaces of the capacitor body, and
the second connection terminal is disposed to be spaced apart from end portions of the fifth and sixth surfaces of the capacitor body.

7. A multilayer electronic component comprising:
a capacitor body including a plurality of dielectric layers and a plurality of first and second internal electrodes alternately disposed with respective dielectric layers interposed therebetween and having first and second surfaces opposing each other in a thickness direction, third and fourth surfaces connected to the first and second surfaces and opposing each other in, a length direction, and fifth and sixth surfaces connected to the first and second surfaces, connected to the third and fourth surfaces, and opposing each other in a width direction, one end of each of the first and second internal electrodes being exposed through the third and fourth surfaces, respectively;
first and second external electrodes including first and second connected portions respectively disposed on the third and fourth surfaces of the capacitor body and first and second band portions respectively extending from the first and second connected portions to portions of the first surface of the capacitor body, respectively;
a first connection terminal disposed on the first band portion; and
a second connection terminal disposed on the second band portion,
wherein a length and a width of the capacitor body are 2.0 mm and 1.2 mm, respectively, and
wherein $0.059 \leq A1/A2 \leq 0.471$ in which A1 is the area of the first or second, connection terminal in the thickness-width direction and A2 is the area of the first or second band portion in the width-length direction.

8. The multilayer electronic component of claim 7, wherein the first and second connection terminals are bump terminals.

9. The multilayer electronic component of claim 8, wherein the bump terminals are made of alumina.

10. The multilayer electronic component of claim 7, wherein the first connection terminal is disposed so that a first solder accommodating portion open toward the third surface of the capacitor body is provided on the first surface of the capacitor body, and
the second connection terminal is disposed so that a second solder accommodating portion open toward the fourth surface of the capacitor body is provided on the first surface of the capacitor body.

11. The multilayer electronic component of claim 7, wherein the first connection terminal is disposed to be spaced apart from end portions of the fifth and sixth surfaces of the capacitor body, and
the second connection terminal is disposed to be spaced apart from end portions of the fifth and sixth surfaces of the capacitor body.

12. A multilayer electronic component comprising:
a capacitor body including a plurality of dielectric layers and a plurality of first and second internal electrodes alternately disposed with respective dielectric layers interposed therebetween and having first and second surfaces opposing each other in a thickness direction, third and fourth surfaces connected to the first and second surfaces and opposing each other in a length direction, and fifth and sixth surfaces connected to the first and second surfaces, connected to the third and fourth surfaces, and opposing each other in a width direction, one end of each of the first and second internal electrodes being exposed through the third and fourth surfaces, respectively;
first and second external electrodes including first and second connected portions respectively disposed on the third and fourth surfaces of the capacitor body and first and second band portions respectively extending from the first and second connected portions to portions of the first surface of the capacitor body, respectively;
a first connection terminal disposed on the first band portion; and
a second connection terminal disposed on the second band portion,
wherein a length and a width of the capacitor body are 3.2 mm and 2.0 mm, respectively, and
wherein $0.072 \leq A1/A2 \leq 0.441$ in which A1 is the area of the first or second connection terminal in the thickness-width direction and A2 is the area of the first or second band portion in the width-length direction.

13. The multilayer electronic component of claim 12, wherein the first and second connection terminals are bump terminals.

14. The multilayer electronic component of claim 13, wherein the bump terminals are made of alumina.

15. The multilayer electronic component of claim 12, wherein the first connection terminal is disposed so that a first solder accommodating portion open toward the third surface of the capacitor body is provided on the first surface of the capacitor body, and
the second connection terminal is disposed so that a second solder accommodating portion open toward the fourth surface of the capacitor body is provided on the first surface of the capacitor body.

16. The multilayer electronic component of claim 12, wherein the first connection terminal is disposed to be spaced apart from end portions of the fifth and sixth surfaces of the capacitor body, and
the second connection terminal is disposed to be spaced apart from end portions of the fifth and sixth surfaces of the capacitor body.

17. The multilayer electronic component of claim 1, wherein a length of the first connection terminal in the length direction is smaller than a length of the first band portion in the length direction, and
a length of the second connection terminal in the length direction is smaller than a length of the second band portion in the length direction.

18. A board having a multilayer electronic component, comprising:
a circuit board having first and second electrode pads disposed on one surface thereof; and
the multilayer electronic component of claim 15 mounted on the circuit board so that the first and second connection terminals are connected to the first and second electrode pads, respectively.

19. A multilayer electronic component comprising:
a capacitor body including a plurality of dielectric layers and a plurality of first and second internal electrodes alternately disposed with respective dielectric layers interposed therebetween and having first and second surfaces opposing each other in a thickness direction, third and fourth surfaces connected to the first and second surfaces and opposing each other in a length direction, and fifth and sixth surfaces connected to the first and second surfaces, connected to the third and fourth surfaces, and opposing each other in a width direction, one end of each of the first and second internal electrodes being exposed through the third and fourth surfaces, respectively;

first and second external electrodes including first and second connected portions respectively disposed on the third and fourth surfaces of the capacitor body and first and second band portions respectively extending from the first and second connected portions to portions of the first surface of the capacitor body, respectively;

a first connection terminal disposed on the first band portion; and a second connection terminal disposed on the second band portion, wherein outermost portions of the first and second connection terminals in the length direction are spaced apart from the third and fourth surfaces of the capacitor body in the length direction to form a solder pocket, and wherein innermost portions of the first and second connection terminals in the length direction are spaced apart from the first surface of the capacitor body in the thickness or length direction.

20. The multilayer electronic component of claim 19, wherein $0.05 \leq A1/A2 \leq 0.504$, where A1 is an area of the first or second connection terminal in a thickness-width direction, and A2 is an area of the first or second band portion in a width-length direction.

21. The multilayer electronic component of claim 19, wherein the first and second connection terminals are bump terminals.

22. The multilayer electronic component of claim 21, wherein the bump terminals are made of alumina.

* * * * *